United States Patent [19]
Clarke

[11] 4,065,683
[45] Dec. 27, 1977

[54] CIRCUITRY FOR INDUSTRIAL LOGIC SYSTEMS

[75] Inventor: Geoffrey Clarke, Blunsdon, near Swindon, England

[73] Assignee: Square D Company, Park Ridge, Ill.

[21] Appl. No.: 678,287

[22] Filed: Apr. 19, 1976

Related U.S. Application Data

[63] Continuation of Ser. No. 478,486, June 12, 1974, abandoned.

[51] Int. Cl.² ............... H03K 17/60; H03K 19/08; H02H 3/00
[52] U.S. Cl. .......................... 307/264; 307/200 A; 307/203; 307/252 B; 307/270; 361/100; 361/101
[58] Field of Search .......... 307/202, 203, 252 B, 307/252 N, 252 T, 264, 270, DIG. 1, 311, 200 A; 317/9 AC, 27 R, 33 R, 33 SC; 361/100, 101

[56] References Cited

U.S. PATENT DOCUMENTS

| | | | |
|---|---|---|---|
| 3,513,332 | 5/1970 | Snyder | 307/252 B |
| 3,643,115 | 2/1972 | Kiffmeyer | 307/DIG. 1 X |
| 3,665,219 | 5/1972 | Teske | 307/252 B |
| 3,751,684 | 8/1973 | Struger | 307/202 |

OTHER PUBLICATIONS

Jenkins, "Interface Circuits Drive High-Level Switches from Low-Level Inputs", *Electronic Engineering* (pub); 5/1971, pp. 45-49.
Heiserman, "Light-Emitting Diodes", *Electronics World* (pub); 1/1968; pp. 36-37, 66-67.
Armstrong, "TTL Interfacing with GRL 111 and GRL 101", *Electronic Applications* (pub.); vol. 30, No. 4; 1970; pp. 145-154.

*Primary Examiner*—John S. Heyman
*Assistant Examiner*—Larry N. Anagnos
*Attorney, Agent, or Firm*—H. J. Rathbun

[57] ABSTRACT

An industrial solid state logic system having a device for translating low level input signals into high level output signals, the components of the device being arranged so that an output switching unit responds only to current flowing from a source when fed from a logic gate which is adapted to sink current although it has the capability to source current. A light emitting diode is connected in a circuit of the device to indicate the electrical condition of an output switching component of the device.

5 Claims, 3 Drawing Figures

CIRCUITRY FOR INDUSTRIAL LOGIC SYSTEMS

This is a continuation of application Ser. No. 478,486, filed June 12, 1974, now abandoned.

BACKGROUND OF THE INVENTION

This invention relates to improvements in industrial solid state logic systems. In many prior systems of this type, one or more signals from the output stage of a logic gate are impressed on the control element of a solid state switch such as a triac in order to control the current supplied to a load through the triac. Generally, such systems translate low level signals of the order of 1 milli-ampere at 4 to 7 volts from the logic system into high level outputs of 2 amperes at 50 to 220 volts for the purpose of energizing loads such as solenoid valves, motor starters, electromagnetic brakes and the like. It is desirable that such output switches only produce an ON state energizing the load when driven by a logic "1" signal.

Many of these logic systems operate by a current sinking technique which gives rise to problems when connected to solid state switches or output drivers. Current sinking refers to the completion of a current path to ground or common which effects a change in the voltage level at a junction in the circuitry thereby to control the output component. An output driver used with current sinking logic is switched ON if the output of the logic gate controlling the driver is at logic "1" and OFF if the output of the logic gate is at logic "0" thereby sinking current from the driver. In such current sinking systems, if the conductor connected to the input of the driver is broken, the logic gate loses control and the driver output then assumes an ON state which erroneously energizes the load.

When source current is used to energize the driver an open circuit will not cause an erroneous driver "ON" state.

Most logic systems are adapted to sink current for their basic operation and only to source enough current to prevent leakage current from degrading the logic voltage noise margins. Therefore it would be desirable to use only the source current from the logic output to produce a logic "1" signal which will turn the driver ON.

Both AC and DC drivers having built in indicator lamps pose two additional problems:

1. the dissipation in the lamp, e.g. 110V at 20 mA = 2.2 watts, is comparable with the total dissipation in the output component, and therefore severely limits the power handling capability of the device, since half or more of the temperature rise can be caused by the indicating lamp alone;

2. the driver can switch any voltage e.g. 6,12,24, or 48 V DC or 48/110V AC within the limits of the output component, but the indicator is effective at only one nominal voltage and must be interchangeable if the driver is to be used over a wide voltage range.

It also would be desirable to have the indicator electrically close to the output component, so that when the driver indicates an ON state, one could be reasonably sure that the output component was conducting. If the indicator were energized by the input signal to the driver, the indicator could be on while the output component was in fact off due to a driver amplifier failure, thus creating a false impression of the driver output state.

The advantages of a light-emitting diode arrangement are:

a. The dissipation in the light emitting diode is typically low, e.g. 40 milli watts, and therefore does not contribute much heat or temperature rise, nor limit the output power handling capability of the output component. b. The driver can be used over a wide voltage range without affecting the indication. c. The system can be checked out with the load power off.

With the exception of failure of the actual output component, this indication does not give rise to a false impression of the driver output state, since it is electically very close to the output component.

SUMMARY OF THE INVENTION

According to the present invention there is provided a device for an industrial logic system for translating low level input signals into high level output signals and wherein the components and circuitry are so arranged that, when the device is connected to a logic gate adapted to sink current and having the capablility to source current, the device is capable of being energized only by the source current.

According to the present invention there is also provided circuitry for an industrial logic system for translating low level signals into high level output signals and including at least one light emitting diode so connected in a circuit to indicate the condition of an output switch.

BRIEF DESCRIPTION OF DRAWINGS

Embodiments of the present invention will now be described by way of example with reference to the accompanying drawings, in which:

As mentioned above many logic systems use forms of current sinking logic which give rise to particular problems. Referring to FIG. 1, which shows such a prior art system, a logic system device includes an output stage of a logic gate 10 connected to an output driver 12. With an output terminal 14 of the logic gate at logic "1", i.e, with a transistor 16 switched on and a transistor 18 off, a terminal 20 of the driver assumes sufficient potential with respect to a common 22 so that base current flows in a transistor 24 and switches the latter to a conductive state, thus energizing a load 26 connected between a collector of the transistor 24 and a positive power line 27. With the output terminal 14 at logic "0", i.e. with transistor 16 off and transistor 18 on, the sink current is sunk by transistor 18 through a resistor 28 to common 22 so as to lower the potential at terminal 20 with respect to common 22 and turn off transistor 24. The magnitude of current which the logic can sink enables only one output transistor to be used for the required output. If the wire connecting terminal 14 to the driver input 20 is broken, the gate 10 loses control of the transistor 24 which will then assume an ON state, erroneously energizing the load 26.

A logic system which is primarily designed to sink current must also have the capability to source current, albeit a small amount, to prevent leakage current degrading the logic voltage noise margins.

Figure 2:
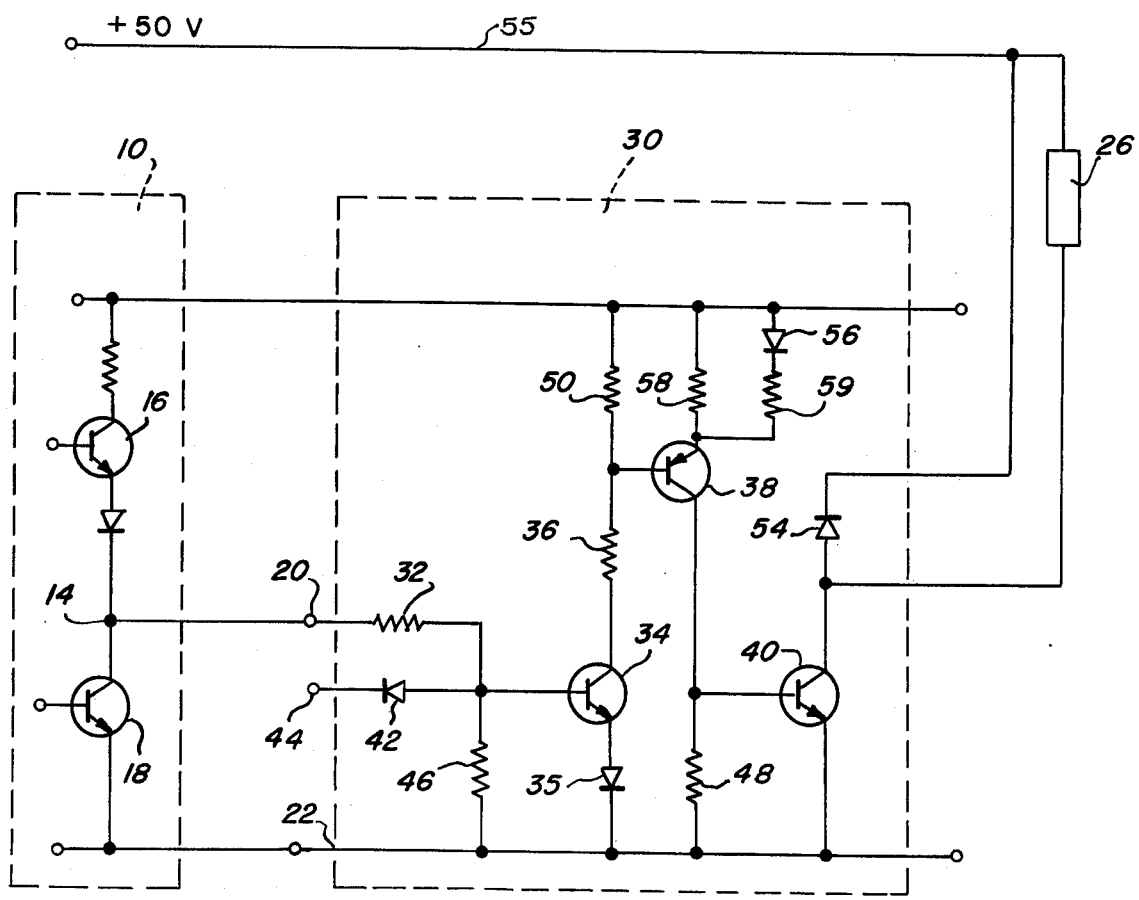
FIG. 2 is a wiring diagram of a first embodiment of a logic system according to the present invention and using current sinking logic.

Referring to FIG. 2, there is shown a logic system device in accordance with this invention wherein the output stage 10 of the logic gate is connected to a DC output driver 30 the latter being designed to be energized by source current flowing through the transistor 16.

In operation of this system, with the output terminal 14 of the logic gate at logic "1", transistor 16 will source a relatively small amount of current into the driver 30 through a resistor 32, a transistor 34 base-to-emitter, and a diode 35 to the common 22. Although the source current is small, it is sufficient to cause the transistor 34 to conduct. Transistor 34 collector current through a resistor 36 will switch a transistor 38 to a conductive state, resulting in a load 26 being energized through an output power transistor 40. Transistor 34 serves as an amplifier for the source current which, in itself, is insufficient to operate the output power transistor 40. Transistor 38 also provides some amplification and regulates the base current of transistor 40 so that it is held within the required limits in spite of the practical variation in transistor 40 base-to-emitter forward voltage drop characteristics.

Referring to the other components in the circuit, a diode 42 and input terminal 44 provide a circuit to clamp transistor 34 base-to-common and make it nonconductive regardless of the signal applied to input terminal 20. The diode 42 is poled to provide protection to the driver circuit by preventing turn on of the transistor 34 by current from the terminal 44. Resistors 46 and 48 provide paths for transistors 34 and 40 collector-to-base leakage currents and reduce their input impedances, so as to improve their immunity to noise which might otherwise raise the base potentials of transistors 34 and 40 sufficient to turn them on inadvertently. Resistor 50 in conjunction with resistor 36 biases the base of transistor 38 negative with respect to its emitter to provide the regulating function mentioned above. Resistor 50 reduces the input impedance of transistor 38 in a manner similar to that described above for resistors 46 and 48. Diode 54 acts as a discharge path for an inductive load and clamps transistor 40 collector to a 50v power line 55, so that the discharge voltage of the load cannot cause the collector-to-emitter voltage on transistor 40 to exceed its capability. With the output 14 of logic gate 10 at logic "0" input terminal 20 is effectively connected by transistors 18 to common, turning off transistor 34.

Figure 1:
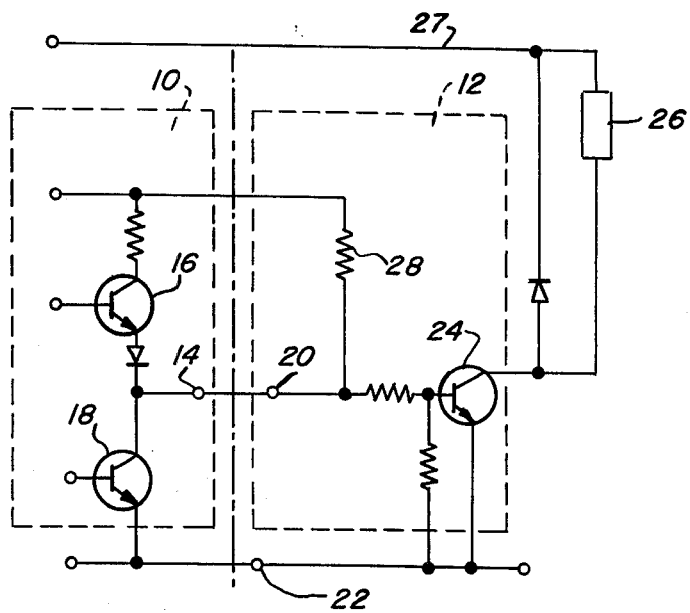
FIG. 1 is a wiring diagram of a prior art logic system using current sinking logic.

With this circuit neither an inadvertent short circuit to ground or common at driver input terminal 20 nor a break in the input connection will cause the load 26 to be energized because the circuit does not depend upon the turn on of the transistor 18 to sink current as does the circuit shown in FIG. 1.

Figure 3:
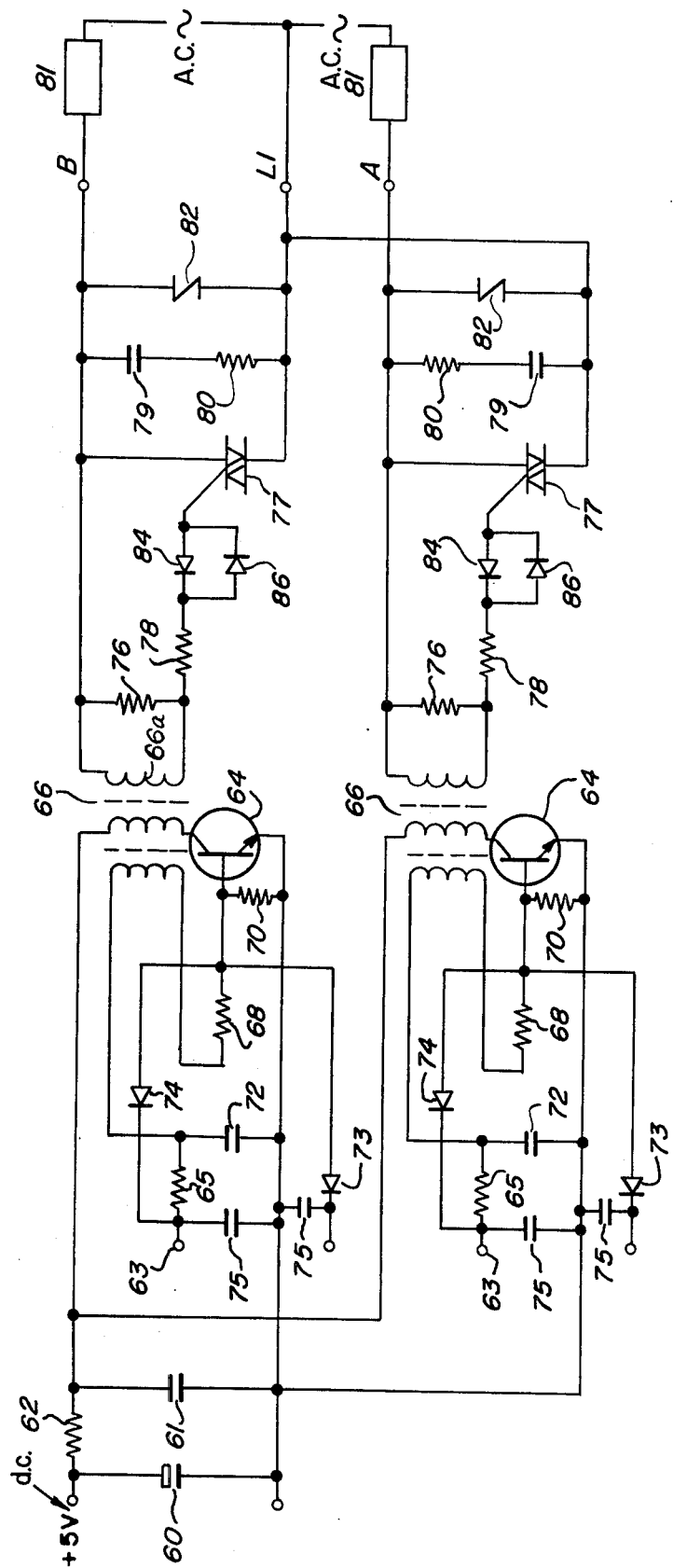
FIG. 3 is a circuit diagram of a second embodiment of a logic system according to the invention and using current sinking logic.

Referring to FIG. 3, the circuit for an ac output driver is shown. The output driver uses a single d.c. power supply to produce two a.c. output terminals A and B. An RC filter to prevent oscillator pulses of the system from being fed back into and modulating the logic power supply comprises a polarized capacitor 60 of relatively low capacitance to filter high frequency noise and a capacitor 61 of relatively high capacitance which is coupled with a resistor 62 to filter low frequency noise. In operation, source current from input terminal 63 to transistor 64 via resistor 65 provides a bias to cause oscillation in the circuit including transistor 64, transformer 66, resistors 65, 68, and 70, and capacitor 72. Diodes 73 and 74 and capacitors 75 form an inhibit circuit to prevent conduction of the transistors 64. A terminal 73a and the diode 73 provide a circuit to clamp transistor 64 to ground and make it nonconductive regardless of the signal applied to input terminal 63 in a manner like that of terminal 44 and diode 42 of FIG. 2. A resistor 76 across a coil 66a of transformer 66 is a damping resistor provided to absorb spurious transients generated in the transformer 66 during operation of the driver which would otherwise degrade normal output pulses from the transformer 66 and interfere with proper firing of a triac 77. The circuit provides an output from transformer 66 though a resistor 78 to fire the triac 77. This energizes loads 81 connected for example, between output terminals A and B and the return line of the supply. Capacitor 79, resistor 80 and a voltage dependent resistor 82 are also provided to prevent spurious firing of the triac 77. The capacitor 79 and the resistor 80 also protect the triac 77 against an excessive rate of rise of impressed voltage and provide a holding circuit for the triac 77 when an inductive load across the output, e.g. A or B to L1, slows the rise in triac current.

In the circuit of the DC output driver (FIG. 2) a light emitting diode 56 is connected to the emitter of transistor 38 and thence into the base of the output power transistor 40. Resistors 58 and 59 split the emitter current of transistor 38 for the light emitting diode 56. The latter is independent of the actual load circuit voltage and current and is as close as possible to the transistor 40, subject to other circuit constraints.

In the AC output driver circuit (FIG. 3) the light emitting diode 84 is connected back-to-back with a rectifying diode 86 directly into the gate of triac 77.

The device for translating low level signals into high level outputs as herein before described may be incorporated in a module such as described in the pending U.S. application Ser. No. 478,475, filed June 12, 1974, now abandoned, and entitled "Packaging of Industrial Logic Systems and the Components Thereof," concurrently filed herewith, and assigned to the assignee of the present invention.

Each light emitting diode is physically arranged to illuminate an aperture in a diagram strip or label mounted on a case such as described in the aforementioned application or an aperture in a diagram mounted on an end wall of the case opposite to terminal posts associated with the case.

In addition an aperture may be provided through a connector assembly for plug-in devices such as described in the aforementioned application so that a light emitting diode plugged into the connector assembly could be seen through an apertured strip or label provided adjacent to terminal posts of the connector assembly.

I claim:

1. A device for use in an industrial logic system for translating a low level input signal into a high level output signal comprising:

A. a logic gate adapted to both sink current and source an output signal less than 7 milli-watts, the gate including:
   1. a first transistor having an emitter and a collector;
   2. a second transistor having an emitter and a collector, the collector being connected to the emitter of the first transistor, the connection providing the output signal of the logic gate when the first transistor is conducting and the second transistor is not conducting; and
3. a first voltage supply connected across the collector of the first transistor and the emitter of the second transistor;

B. a second voltage supply;
C. a load; and
D. an output driver connected in series with the load across the second voltage supply, the driver including:
 1. a third transistor connected to be controlled only by the output signal from the logic gate by having a base connected in a base circuit to the output of the logic gate so that the third transistor is in a non-conductive state when the logic gate is sinking current or when the base circuit is inadvertently open or grounded;
 2. an input terminal connectible to a common rail through a diode to clamp the base circuit and make the third transistor non-conductive and thus non-responsive to the output of the logic gate;
 3. a resistor connected to the third transistor to reduce the input impedance of said third transistor and thereby increase the sensitivity of the third transistor; and
 4. means for responding to the conduction of the third transistor to cause the ouput driver to emit an output signal greater than 100 watts and responsive to non-conduction of the third transistor to prevent the output from emitting an output signal when the logic gate does not source a current.

2. A device as claimed in claim 1 wherein the means for responding comprises:
 A. a fourth transistor for providing the output signal for controlling the load; and
 B. a fifth transistor regulating the base of the fourth transistor and having its conductive state controlled by the third transistor.

3. A device as claimed in claim 2 wherein the fifth transistor has an emitter connected in an emitter circuit, and a light emitting diode is connected in the emitter circuit to indicate the condition of the fourth transistor.

4. A device as claimed in claim 1 wherein the means for responding comprises:
 A. an oscillative circuit connected in the base circuit and biased into oscillation by current flowing in the base circuit including a transformer having one winding in the base circuit and an output winding; and
 B. a triac having a gate electrode connected to the output winding and firing in response to output pulses from the oscillative circuit.

5. A device as claimed in claim 4 wherein a light emitting diode connected back-to-back with another diode is connected to the gate electrode of the triac to indicate the condition of the triac.

* * * * *